US010056372B2

(12) United States Patent
Alexander

(10) Patent No.: US 10,056,372 B2
(45) Date of Patent: Aug. 21, 2018

(54) DOUBLE-BASE-CONNECTED BIPOLAR TRANSISTORS WITH PASSIVE COMPONENTS PREVENTING ACCIDENTAL TURN-ON

(71) Applicant: Ideal Power Inc., Austin, TX (US)

(72) Inventor: William C. Alexander, Spicewood, TX (US)

(73) Assignee: Ideal Power Inc., Austin, TX (US)

(*) Notice: Subject to any disclaimer, the term of this patent is extended or adjusted under 35 U.S.C. 154(b) by 0 days.

(21) Appl. No.: 15/396,233

(22) Filed: Dec. 30, 2016

(65) Prior Publication Data
US 2017/0271328 A1    Sep. 21, 2017

Related U.S. Application Data

(60) Provisional application No. 62/308,660, filed on Mar. 15, 2016.

(51) Int. Cl.
| | | |
|---|---|---|
| H01L 29/423 | (2006.01) | |
| H03K 17/687 | (2006.01) | |
| H01L 27/06 | (2006.01) | |
| H01L 29/10 | (2006.01) | |
| H01L 29/40 | (2006.01) | |
| H01L 29/417 | (2006.01) | |
| H01L 29/732 | (2006.01) | |
| H03K 17/567 | (2006.01) | |
| H03K 17/66 | (2006.01) | |

(52) U.S. Cl.
CPC ...... *H01L 27/0694* (2013.01); *H01L 29/1004* (2013.01); *H01L 29/407* (2013.01); *H01L 29/41708* (2013.01); *H01L 29/7322* (2013.01); *H03K 17/567* (2013.01); *H03K 17/668* (2013.01)

(58) Field of Classification Search
CPC ............ H01L 29/0821; H01L 29/1004; H01L 29/1095; H01L 29/872; H01L 27/0694; H01L 29/735; H02M 1/08
USPC ........................................................ 327/109
See application file for complete search history.

(56) References Cited

U.S. PATENT DOCUMENTS

| | | | | |
|---|---|---|---|---|
| 4,081,822 A | * | 3/1978 | Dao ..................... | G06F 7/501 257/560 |
| 7,443,245 B2 | * | 10/2008 | Tsurumaki ............. | H03F 1/301 330/134 |
| 2009/0014838 A1 | | 1/2009 | Arai et al. | |

(Continued)

FOREIGN PATENT DOCUMENTS

JP        2005136290 A        5/2005

OTHER PUBLICATIONS

International Search Report, PCT/US2016/069618, dated Apr. 18, 2017, ISA/KR.

(Continued)

*Primary Examiner* — Dinh T Le
(74) *Attorney, Agent, or Firm* — Groover & Associates PLLC; Robert O. Groover, III; Gwendolyn G. Corcoran

(57) ABSTRACT

The present application discloses new approaches to providing "passive-off" protection for a B-TRAN-like device. Even if the control circuitry is inactive, AC coupling uses transient voltage on the external terminals to prevent forward biasing an emitter junction. Preferably the same switches which implement diode-mode and pre-turnoff operation are used as part of the passive-off circuit operation.

8 Claims, 5 Drawing Sheets

(56) References Cited

U.S. PATENT DOCUMENTS

2010/0001783 A1 1/2010 Ronsisvalle et al.
2012/0032233 A1 2/2012 Qian
2015/0311777 A1 10/2015 Alexander et al.

OTHER PUBLICATIONS

Written Opinion of the International Searching Authority, PCT/US2016/069618, dated Apr. 18, 2017, ISA/KR.
"Leakage (electronics)." Wikipedia. Updated Dec. 19, 2017. Retrieved Mar. 26, 2018 from <https://en.wikipedia.org/wiki/Leakage_(electronics)>.
B. Jayant Baliga, "Fundamentals of Power Semiconductor Devices." Springer Science & Business Media, Sep. 5, 2008. p. 7.
"Slew rate." Wikipedia. Updated Mar. 15, 2018. Retrieved Mar. 26, 2018 from <https://en.wikipedia.org/wiki/Slew_rate>.

\* cited by examiner

DOUBLE-BASE-CONNECTED BIPOLAR TRANSISTORS WITH PASSIVE COMPONENTS PREVENTING ACCIDENTAL TURN-ON

CROSS-REFERENCE

Priority is claimed from U.S. provisional application 62/308,660, which is hereby incorporated by reference.

BACKGROUND

The present application relates to solid-state switches using bipolar conduction, and more particularly to bipolar transistors using two base connections.

Note that the points discussed below may reflect the hindsight gained from the disclosed inventions, and are not necessarily admitted to be prior art.

Published US application US 2014-0375287 (which is hereby incorporated by reference in its entirety) discloses (inter alia) novel bidirectional bipolar transistors known as "B-TRANs." Further improvements to the B-TRAN device and its modes of operation where disclosed in application Ser. Nos. 14/937,814 and 14/882,316.

One sample embodiment of a B-TRAN can be seen in FIG. 1B. Note that the two surfaces of the die are essentially identical.

A sample circuit symbol is shown in FIG. 2. This circuit symbol resembles that of a bipolar junction transistor, except that two base connections are shown. This corresponds to the device structure of FIG. 1B, where two different base contact regions are placed on the two surfaces of the die.

FIG. 3 shows one sample embodiment of a B-TRAN drive circuit, as extensively described in the parent applications.

FIG. 4 shows another sample embodiment of a B-TRAN. In this embodiment the trenches contain field plates; the capacitive coupling to the field plates helps to smooth the nearby voltage gradient in the vertical direction.

The preferred modes of operation of the BTRAN are surprisingly complex. To achieve high bipolar gain reliably, in a bidirectional device, the parent applications teach that the following stages of operation can be used.

At turn-on, an initial flow of current is allowed to occur in "diode mode" before bipolar transistor operation begins. In diode mode, the voltage drop across the device is (of course) at least a diode drop; but when base current drive is applied, the forward voltage drop can be reduced to a few hundred millivolts.

At turn-off, base current is disabled first, so that the device is again operating as a diode. After this, the device can be put into the "active off" mode, where one of the two junctions is reverse biased and blocks current.

A further surprising mode taught in the parent application is the "passive-off" mode. A problem with a fully bidirectional device is that the bipolar gain can interfere with current blocking in the off state. To avoid this, the emitter junction on either surface of the device is clamped to avoid any significant forward bias. (Properly, the "emitter junction" referred to here is the junction between either of the (typically n-type) emitter/collector regions and the (typically p-type) substrate.) By keeping the emitter junctions well away from turn-on, minority carrier injection is limited, and the gain of the bipolar transistor does not degrade the breakdown voltage.

Double-Base Connected Bipolar Transistors with Passive Components Preventing Accidental Turn-on The present application discloses new approaches to providing "passive-off" protection for a B-TRAN-like device. Even if the control circuitry is inactive, AC coupling uses transient voltage on the external terminals to prevent forward biasing an emitter junction. Thus the transistor's gain is automatically prevented from degrading the breakdown voltage when the device is off. Preferably each surface of the device has a base contact region and an emitter/collector region; the polarity of the externally applied voltage will determine which of the two emitter/collector regions will act as emitter, and which as collector. The passive turnoff circuit clamps each base contact region to less than a diode drop from the neighboring emitter/collector region, so that bipolar transistor operation is avoided.

The new passive-off circuitry is particularly (but not only) advantageous in soft-switched applications, such as power-packet-switching (PPSA) converter.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The present application describes a new implementation of the passive-off mode described in published US application US 2014-0375287.

The present application discloses new approaches to providing "passive-off" protection for a B-TRAN-like device. Even if the control circuitry is inactive, AC coupling uses transient voltage on the external terminals to prevent forward biasing an emitter junction.

Figure 1A:
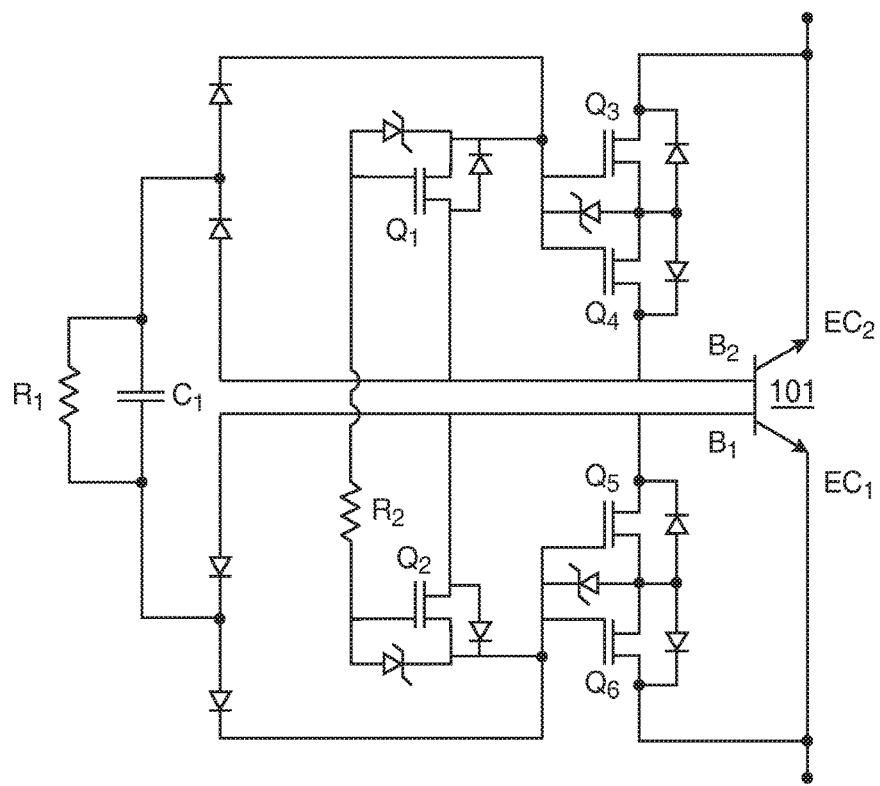
FIG. 1A shows an example of a B-TRAN switching circuit, including "passive-off" circuitry which avoids breakdown voltage degradation due to amplification of transients.
Figure 1B:
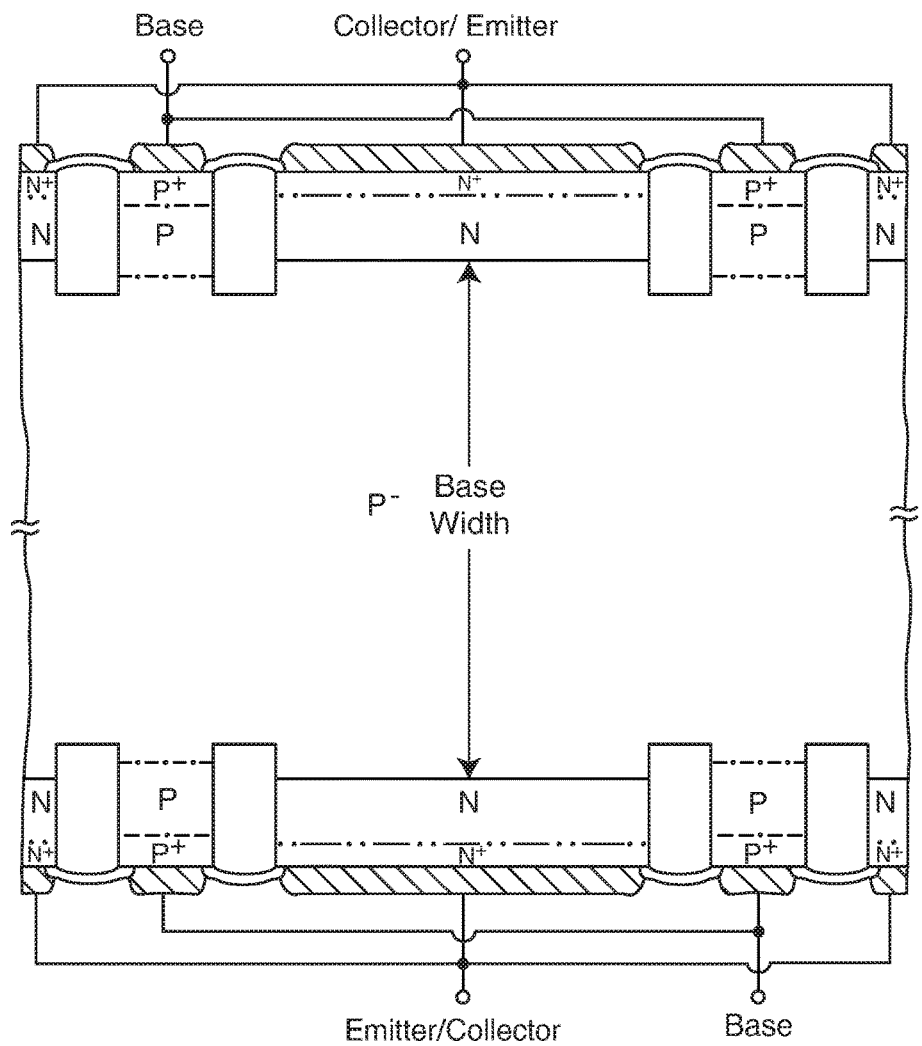
FIG. 1B shows one sample embodiment of a B-TRAN.
Figure 2:
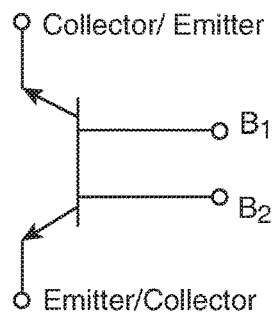
FIG. 2 shows a sample circuit symbol for a B-TRAN.

The exemplary circuit of FIG. 1A shorts the e-base to emitter when external voltage is applied across collector to emitter (Vce), and before base control power is available, so as to allow the B-TRAN to block the applied Vce.

The new passive-off circuitry is particularly applicable to soft-switched applications, such as power-packet-switching (PPSA) converter. For hard-switched applications, the capacitor C1 will retard the switching speed. A voltage-limiting circuit with solid-state switches (or even with mechanical relays) may be more advantageous in such applications.

Device 101 is a "B-TRAM" type transistor, i.e. a bipolar transistor with two base contact regions which are separately operated. This is a fully bidirectional device, with voltage blocking and current conduction available in both directions. In this example the B-TRAN 101 is assumed to be an npn device, i.e. the emitter/collector regions are n-type, the substrate is p-type, and the base contact regions are p-type. (Other device structures may be present too.)

In this example, assume that the external terminal at the top of the page starts to go high, and the control circuitry is not active. This will make connection EC2 the collector terminal, and EC1 the emitter terminal. Connection B1 therefore operates as the e-base, and connection B2 as the c-base.

Some charge will necessarily shift to create a depletion region, which is required to block conduction. However, the challenge is to avoid any gain on the emitter side, which would degrade the breakdown voltage. The voltage at the emitter junction (EC1/B1) must therefore be kept below a diode drop.

Resistor R1 holds capacitor C1 at zero voltage when the device is fully powered down. When terminal EC2 starts to go positive, current will flow through C1 to pull the gates of MOS transistors Q5 and Q6 high. This turns them on, to pull the e-base terminal (B1 at the moment) toward the emitter (EC1 at the moment).

Note that the MOS transistors Q3+Q4 and Q5+Q6, which were used for diode-mode and pre-turnoff modes, are now also used as part of the passive-off circuitry. This is significantly different from the passive-off circuitry disclosed in previous applications regarding operation of a B-TRAN device.

Note also that resistor R2 connects the gates of p-channel MOS transistors Q1 and Q2 together. This subcircuit helps to keep transistors Q3 and Q4 off while Q5 and Q6 are turning on.

The present application describes a new implementation of the passive-off mode described in published US application US 2014-0375287.

Figure 3:
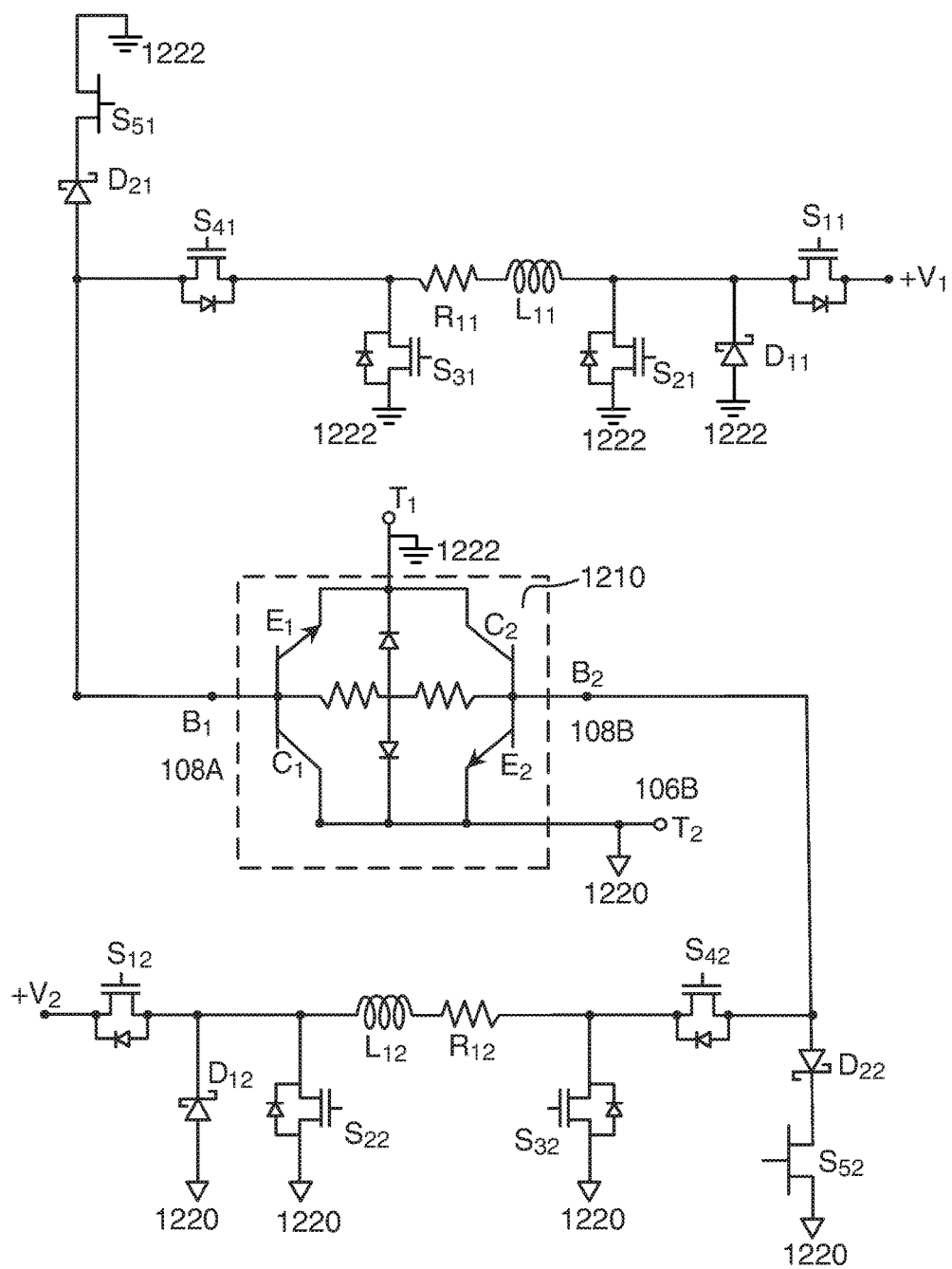
FIG. 3 shows one sample embodiment of a B-TRAN drive circuit.
Figure 4:
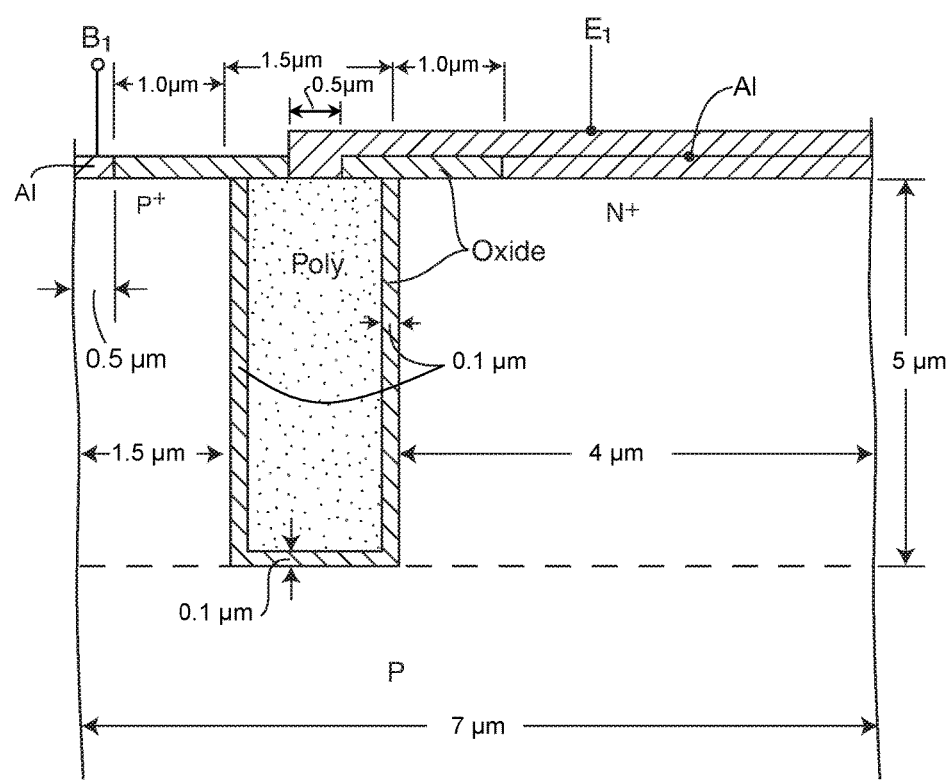
FIG. 4 shows another sample embodiment of a B-TRAN.
Figure 5:
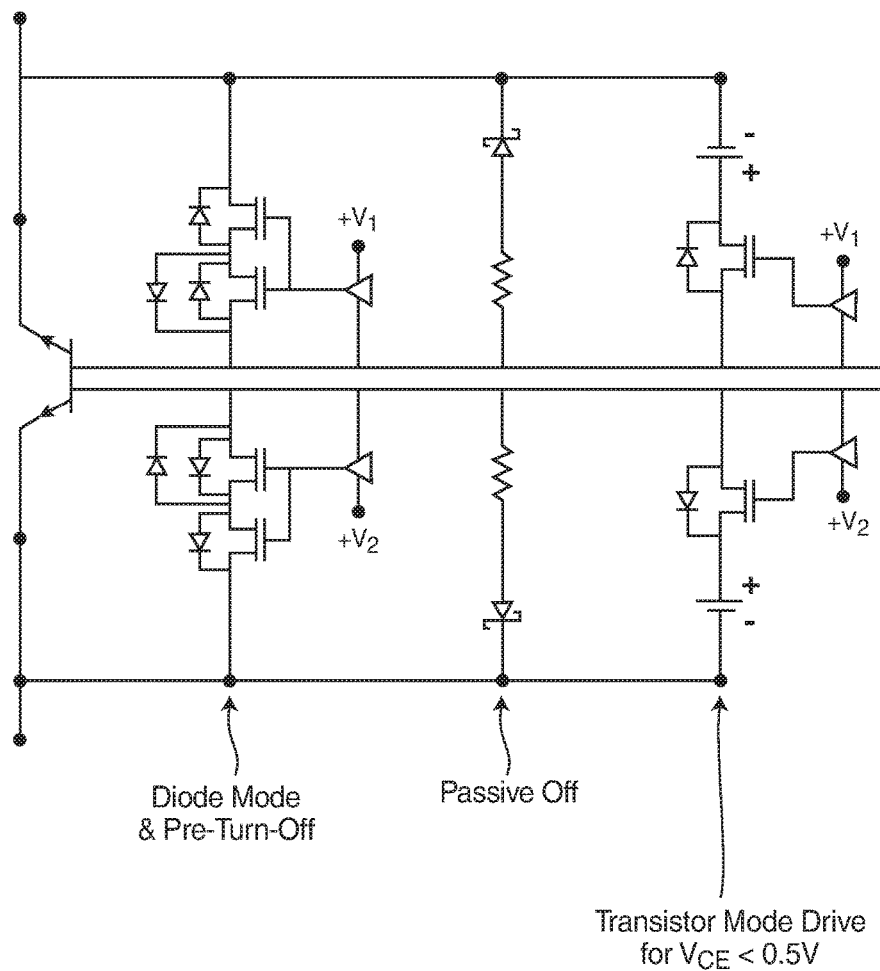
FIG. 5 shows an alternative circuit realization of the passive-off function.

FIG. 5 shows an alternative circuit realization of the passive-off function. The normally-ON switches (implemented as JFETs in FIG. 3, which corresponds to FIG. 12 of WO2014/210072) are replaced by resistors.

In selecting the resistors to replace the normally-ON switches, the ON- and OFF-state behaviors must be balanced. The breakdown voltage in passive-off mode must be sufficiently high, while not significantly reducing the gain.

A B-TRAN is in the "active off-state" when the e-base (base on emitter side) is shorted to the emitter, and the c-base (base on the collector side) is open. In this state with the NPN B-TRAN, the collector is the anode (high voltage side), and the emitter is the cathode (low voltage side).

The B-TRAN is also off when both bases are open, but due to the high gain of the B-TRAN in this state, the breakdown voltage is low. The series combination of a normally-on JFET (as in earlier versions, shown in FIG. 3) and a Schottky diode, or a resistor (as taught herein, shown in FIG. 5) and a Schottky diode, attached between each base on its respective emitter/collector, as previously disclosed, will significantly increase the blocking voltage in this "passive off-state". The JFETs, if present, are turned off during normal operation.

One advantageous sample method for turn-on is to simultaneously, from the active off-state and blocking forward voltage, open the e-base to emitter short while shorting the c-base to the collector. This immediately introduces charge carries into the highest field region of the depletion zone around the collector/base junction, so as to achieve very fast, forward biased turn-on for hard switching, very similar to IGBT turn-on.

Another advantageous sample turn-on method, from the active off-state, is to have the circuit containing the B-TRAN reverse the B-TRAN polarity, which produces the same base state described in the hard turn-on method, but at near zero voltage. That is, the e-base which is shorted to the emitter becomes the c-base shorted to the collector as the B-TRAN voltage reverses from the active off-state polarity. And again, turn-on is fast.

In a third sample turn-on method from the active off-state, the e-base is disconnected from the emitter, and connected to a current or voltage source of sufficient voltage to inject charge carriers into the base region. This method is likely slower, since the charge carriers go into the base just below the depletion zone. Also, it is known that carrier injection into the e-base results in inferior gain relative to carrier injection into the c-base.

After turn-on is achieved with either of the methods using the c-base, Vce is more than a diode drop. To drive Vce below a diode drop, turn-on goes to the second stage of increased charge injection into the c-base via a voltage or current source. The amount of increased charge injection determines how much Vce is reduced below a diode drop. Injection into the e-base will also reduce Vce, but the gain is much lower than with c-base injection.

Turn-off can be achieved by any of several methods. The most advantageous method is a two-step process. In the first step, the c-base is disconnected from the carrier injection power supply and shorted to the collector, while the previously open e-base is shorted to the emitter. This results in a large current flow between each base and its emitter/collector, which rapidly removes charge carriers from the drift region. This in turn results in a rising Vce as the resistivity of the drift region increases. At some optimum time after the bases are shorted, the connection between the c-base and the collector is opened, after which Vce increases rapidly as the depletion region forms around the collector/base junction.

Alternately, turn-off can be achieved by simply opening the c-base and shorting the e-base to the emitter, but this will result in higher turn-off losses since the drift region (base) will have a high level of charge carriers at the start of depletion zone formation.

Or, turn-off can be achieved by simply opening the c-base and leaving the e-base open, but this will result in the highest turn-off losses and also a low breakdown voltage.

Advantages

The disclosed innovations, in various embodiments, provide one or more of at least the following advantages. However, not all of these advantages result from every one of the innovations disclosed, and this list of advantages does not limit the various claimed inventions.

Improved efficiency in power conversion systems;
Power semiconductor devices with more ruggedness;
Power semiconductor devices with higher breakdown voltage;
Power semiconductor devices with lower on-resistance:
Power semiconductor devices with lower cost.

According to some but not necessarily all embodiments, there is provided: The present application discloses new approaches to providing "passive-off" protection for a B-TRAN-like device. Even if the control circuitry is inactive, AC coupling uses transient voltage on the external terminals to prevent forward biasing an emitter junction.

Preferably the same switches which implement diode-mode and pre-turnoff operation are used as part of the passive-off circuit operation.

According to some but not necessarily all embodiments, there is provided: A switching circuit, comprising: a power semiconductor device which includes first and second first-conductivity-type emitter/collector regions on respective surfaces of a second-conductivity-type semiconductor die, separately defining first and second emitter junctions, and a first base contact region on the same surface as the first emitter/collector region, and a second base contact region on the same surface as the second emitter/collector region, both base contact regions separately making ohmic contact to the semiconductor die; first drive transistors which, when ON, operatively connect the first base contact region to the first emitter/collector; and second drive transistors which, when ON, operatively connect the second base contact region to the second emitter/collector region; and a transient coupling circuit which is operatively connected to electrically connect voltage slew across the emitter/collector regions to activate the drive transistors of whichever of the emitter/collector regions is becoming the emitter, to limit the voltage between that emitter/collector region and its corresponding base contact region; a control circuit which drives the first and second base contact regions independently, to control turn on and turn off of conduction, including switching phases where the first drive transistors and second drive transistors connect at least one of the emitter/collector regions with its corresponding base contact region; whereby forward voltage on the first emitter junction is limited to less than the forward diode voltage drop characteristic of the first emitter junction, and forward voltage on the second emitter junction to less than the forward diode voltage drop characteristic of the second emitter junction; and thereby leakage currents are not amplified when the control circuit is inactive, and breakdown voltage is not degraded by amplification of leakage currents.

According to some but not necessarily all embodiments, there is provided: A switching circuit, comprising: a power semiconductor device which includes first and second first-conductivity-type emitter/collector regions on respective surfaces of a second-conductivity-type semiconductor die, separately defining first and second emitter junctions, and first and second base contact regions on the same two surfaces as the first and second emitter/collector regions respectively, both base contact regions separately making ohmic contact to the semiconductor die; first drive transistors which, when ON, operatively connect the first base contact region to the first emitter/collector; and second drive transistors which, when ON, operatively connect the second base contact region to the second emitter/collector region; and a transient coupling circuit which electrically couples voltage slew from a collector-side one of the emitter/collector regions to activate the drive transistors of the opposite emitter/collector; a control circuit which drives the first and second base contact regions independently, including switching phases where the first drive transistors and/or second drive transistors connect at least one of the emitter/collector regions with its corresponding base contact region; whereby forward voltage on the first emitter junction is limited to less than the forward diode voltage drop characteristic of the first emitter junction, and forward voltage on the second emitter junction to less than the forward diode voltage drop characteristic of the second emitter junction.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is, among others (and, without exclusion, in addition to any other points which are indicated herein as inventive and/or surprising and/or advantageous):

1. A switching circuit, comprising:
   a power semiconductor device which includes first and second first-conductivity-type emitter/collector regions on first and second respective surfaces of a second-conductivity-type semiconductor die, separately defining first and second emitter junctions, and a first base contact region on the same surface as the first emitter/collector region, and a second base contact region on the same surface as the second emitter/collector region, both base contact regions separately making ohmic contact to the second-conductivity-type semiconductor die;
   first drive transistors which, when ON, operatively connect the first base contact region to the first emitter/collector; and second drive transistors which, when ON, operatively connect the second base contact region to the second emitter/collector region; and
   a transient coupling circuit which is operatively connected to electrically connect voltage slew rate across the first and second emitter/collector regions to activate the drive transistors of whichever of the first and second emitter/collector regions is becoming an acting emitter, to limit voltage between that emitter/collector region and its corresponding base contact region;
   a control circuit which drives the first and second base contact regions independently, to control turn on and turn off of conduction, including switching phases where the first drive transistors and second drive transistors connect at least one of the emitter/collector regions with its corresponding base contact region;
   whereby forward voltage on the first emitter junction is limited to less than the forward diode voltage drop characteristic of the first emitter junction, and forward voltage on the second emitter junction to less than the forward diode voltage drop characteristic of the second emitter junction; and thereby leakage currents are not amplified when the control circuit is inactive, and breakdown voltage is not degraded by amplification of leakage currents.

2. The switching circuit of claim 1, wherein the die is silicon.

3. The switching circuit of claim 1, wherein the emitter/collector region on the first said surface is not electrically connected to the emitter/collector region on the second said surface.

4. The switching circuit of claim 1, wherein the base contact region on the first said surface is not electrically connected to the base contact region on the second said surface, except through the semiconductor die itself.

5. A switching circuit, comprising:
a power semiconductor device which includes first and second first-conductivity-type emitter/collector regions on first and second respective surfaces of a second-conductivity-type semiconductor die, separately defining first and second emitter junctions, and first and second base contact regions on the same two surfaces as the first and second emitter/collector regions respectively, both base contact regions separately making ohmic contact to the second-conductivity-type semiconductor die;
first drive transistors which, when ON, operatively connect the first base contact region to the first emitter/collector; and second drive transistors which, when ON, operatively connect the second base contact region to the second emitter/collector region; and
a transient coupling circuit which electrically couples voltage slew rate from a collector-side one of the emitter/collector regions to activate the drive transistors of the opposite emitter/collector;
a control circuit which drives the first and second base contact regions independently, including switching phases where the first drive transistors and/or second drive transistors connect at least one of the emitter/collector regions with its corresponding base contact region;
whereby forward voltage on the first emitter junction is limited to less than the forward diode voltage drop characteristic of the first emitter junction, and forward voltage on the second emitter junction to less than the forward diode voltage drop characteristic of the second emitter junction.

6. The switching circuit of claim 5, wherein the die is silicon.

7. The switching circuit of claim 5, wherein the emitter/collector region on the first said surface is not electrically connected to the emitter/collector region on the second said surface.

8. The switching circuit of claim 5, wherein the base contact region on the first said surface is not electrically connected to the base contact region on the second said surface, except through the semiconductor die itself.

* * * * *